(12) United States Patent
Happ et al.

(10) Patent No.: US 8,003,971 B2
(45) Date of Patent: Aug. 23, 2011

(54) INTEGRATED CIRCUIT INCLUDING MEMORY ELEMENT DOPED WITH DIELECTRIC MATERIAL

(75) Inventors: Thomas Happ, Dresden (DE); Jan Boris Philipp, Munich (DE)

(73) Assignee: Qimonda AG, Munich (DE)

( * ) Notice: Subject to any disclaimer, the term of this patent is extended or adjusted under 35 U.S.C. 154(b) by 475 days.

(21) Appl. No.: 12/051,437

(22) Filed: Mar. 19, 2008

(65) Prior Publication Data
US 2009/0237983 A1    Sep. 24, 2009

(51) Int. Cl.
H01L 21/00    (2006.01)

(52) U.S. Cl. ............... 257/3; 257/4; 257/257; 257/268; 257/E21.647; 257/E21.669; 257/E23.145; 257/E23.149; 257/E45.002

(58) Field of Classification Search ............ 257/3, 4, 257/42, 246–257, 268, 537, 758, E21.647–E21.669, 257/23.145–149, 27.004, 29.017, 45.002
See application file for complete search history.

(56) References Cited

U.S. PATENT DOCUMENTS

| | | | |
|---|---|---|---|
| 6,653,193 B2 * | 11/2003 | Gilton | 438/286 |
| 6,869,841 B2 * | 3/2005 | Xu | 438/239 |
| 6,873,541 B2 * | 3/2005 | Lung et al. | 365/153 |
| 6,881,623 B2 * | 4/2005 | Campbell et al. | 438/257 |
| 7,061,013 B2 * | 6/2006 | Hideki | 257/42 |
| 7,115,927 B2 * | 10/2006 | Hideki et al. | 257/296 |
| 7,211,819 B2 * | 5/2007 | Karpov | 257/4 |
| 7,319,235 B2 * | 1/2008 | Happ | 257/2 |
| 7,384,825 B2 * | 6/2008 | Park et al. | 438/133 |
| 7,402,851 B2 * | 7/2008 | Hideki et al. | 257/246 |
| 7,473,597 B2 * | 1/2009 | Lee et al. | 438/253 |
| 7,534,625 B2 * | 5/2009 | Karpov et al. | 438/3 |
| 7,615,439 B1 * | 11/2009 | Schricker et al. | 438/237 |
| 7,622,307 B2 * | 11/2009 | Park et al. | 438/3 |
| 7,678,642 B2 * | 3/2010 | Chang | 438/233 |
| 7,696,503 B2 * | 4/2010 | Lung et al. | 257/2 |
| 7,749,898 B2 * | 7/2010 | Besser et al. | 438/664 |
| 2005/0029502 A1 | 2/2005 | Hudgens | |
| 2005/0041467 A1 * | 2/2005 | Chen | 365/184 |
| 2007/0010082 A1 * | 1/2007 | Pinnow et al. | 438/602 |
| 2007/0138458 A1 * | 6/2007 | Lung | 257/4 |
| 2007/0241319 A1 * | 10/2007 | Chang | 257/3 |
| 2007/0267620 A1 | 11/2007 | Happ | |
| 2007/0267721 A1 | 11/2007 | Kuh et al. | |
| 2008/0185574 A1 * | 8/2008 | Campbell et al. | 257/4 |
| 2009/0114898 A1 * | 5/2009 | Ricker | 257/3 |
| 2009/0137080 A1 * | 5/2009 | Chang et al. | 438/95 |

OTHER PUBLICATIONS

"Application of a DC Glow Discharge Source with Controlled Plasma Potential in Plasma Immersion Ion Implantation", M. Ueda, et al., American Institute of Physics, 1999, (4 pgs.).
"Plasma Immersion Ion Implantation Using Plasmas Generated by Radio Frequency Techniques", J. Tendys, et al., American Institute of Physics, 1988, (3 pgs.).

* cited by examiner

*Primary Examiner* — Michael S Lebentritt
(74) *Attorney, Agent, or Firm* — Dicke, Billig & Czaja, PLLC

(57) ABSTRACT

An integrated circuit includes a first electrode, a second electrode, and a damascene structured memory element coupled to the first electrode and the second electrode. The memory element has a height and a width. The height is greater than or equal to the width. The memory element includes resistance changing material doped with dielectric material.

21 Claims, 10 Drawing Sheets

INTEGRATED CIRCUIT INCLUDING MEMORY ELEMENT DOPED WITH DIELECTRIC MATERIAL

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state—"set"—and from the crystalline state to the amorphous state—"reset"—in response to temperature changes. The temperature changes of the phase change material may be achieved by driving current through the phase change material itself or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The temperature in the phase change material in each memory cell generally corresponds to the applied level of current and/or voltage to achieve the heating.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence the cell resistance is controlled via a suitable write strategy.

Future technology nodes for phase change memories may require phase change material having a high aspect ratio, such as one to one or higher. For example, the height of the phase change material in a phase change memory cell may exceed its width by a factor of two, three, four, or more. Typically, etching phase change material damages the phase change properties. Therefore, instead of etching the phase change material to achieve a desired size and shape, a filling or damascene process may be used.

For these and other reasons, there is a need for the present invention.

SUMMARY

One embodiment provides an integrated circuit. The integrated circuit includes a first electrode, a second electrode, and a damascene structured memory element coupled to the first electrode and the second electrode. The memory element has a height and a width. The height is greater than or equal to the width. The memory element includes resistance changing material doped with dielectric material.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
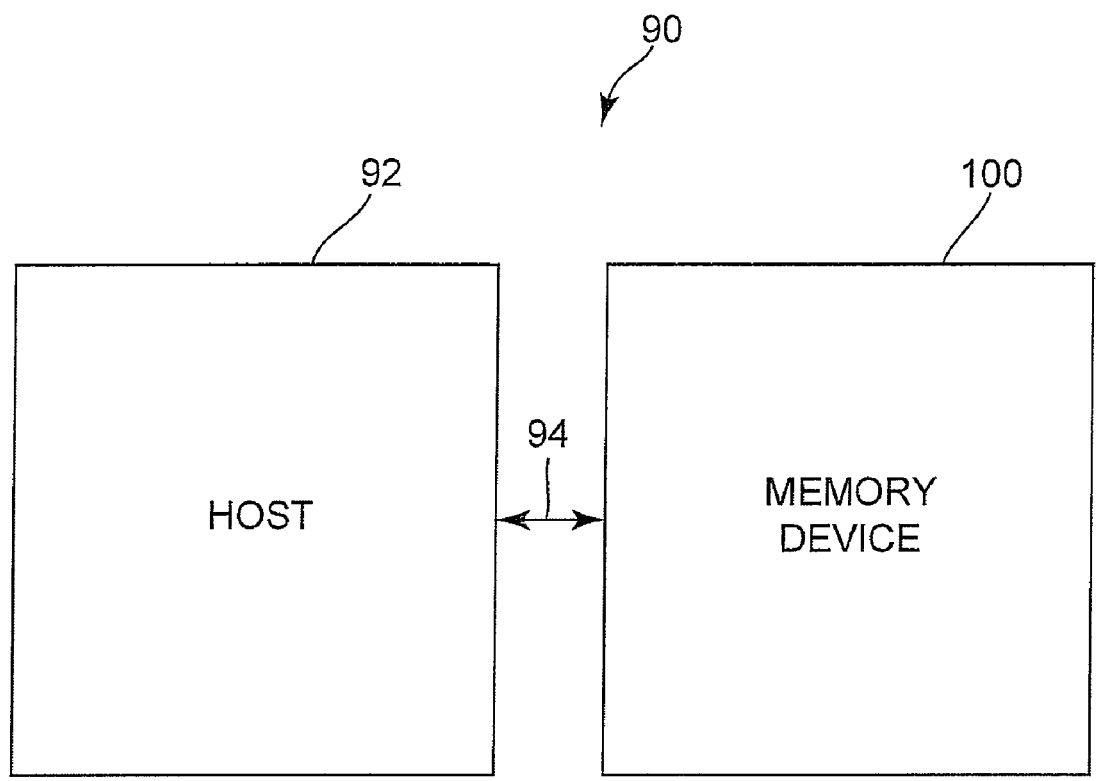
FIG. 1 is a block diagram illustrating one embodiment of a system.

FIG. 1 is a block diagram illustrating one embodiment of a system 90. System 90 includes a host 92 and a memory device 100. Host 92 is communicatively coupled to memory device 100 through communication link 94. Host 92 includes a microprocessor, computer (e.g., desktop, laptop, handheld), portable electronic device (e.g., cellular phone, personal digital assistant (PDA), MP3 player, video player, digital camera), or any other suitable device that uses memory. Memory device 100 provides memory for host 92. In one embodiment, memory device 100 includes a phase change memory device or other suitable resistive or resistivity changing material memory device.

Figure 2:
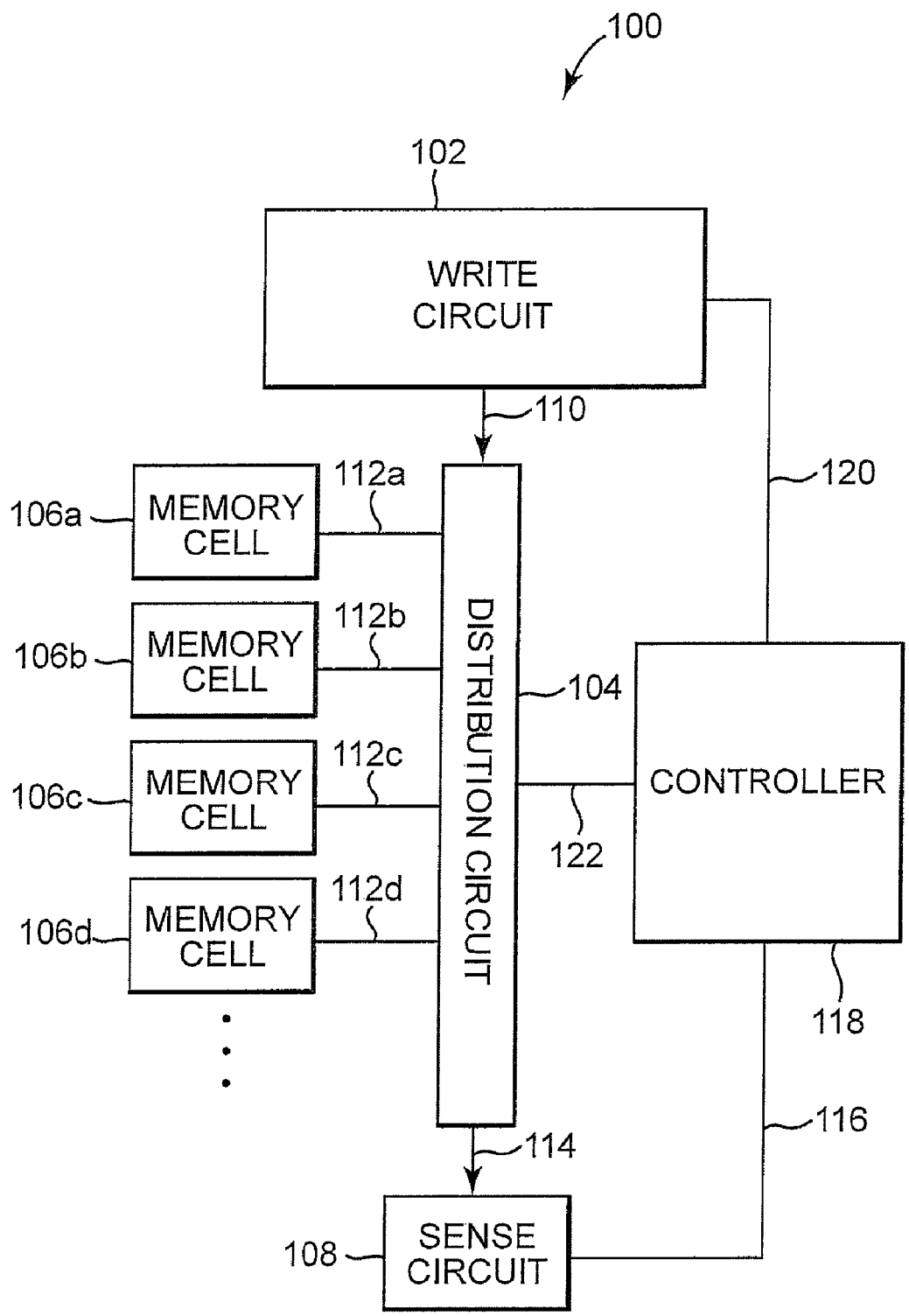
FIG. 2 is a block diagram illustrating one embodiment of a memory device.

FIG. 2 is a block diagram illustrating one embodiment of memory device 100. In one embodiment, memory device 100 is an integrated circuit or part of an integrated circuit. Memory device 100 includes a write circuit 102, a distribution circuit 104, memory cells 106a, 106b, 106c, and 106d, a controller 118, and a sense circuit 108. Each of the memory cells 106a-106d is a phase change memory cell that stores data based on the amorphous and crystalline states of phase change material in the memory cell. Also, each of the memory cells 106a-106d can be programmed into one of two or more states by programming the phase change material to have intermediate resistance values. To program one of the memory cells 106a-106d to an intermediate resistance value, the amount of crystalline material coexisting with amorphous material and hence the cell resistance is controlled using a suitable write strategy.

Each of the memory cells 106a-106d includes phase change material doped with dielectric material. The phase change material is structured using a damascene process. The phase change material is deposited into an opening formed in dielectric material over a bottom electrode. The phase change material is deposited using chemical vapor deposition (CVD), atomic layer deposition (ALD), physical vapor deposition (PVD), solution based spin-on, or other suitable deposition technique. The phase change material is then doped with dielectric material to improve the phase change properties of the phase change material.

In one embodiment, the phase change material is doped by selectively oxidizing one or more components of the deposited phase change material. In another embodiment, the deposited phase change material is doped using implantation. In either embodiment, the complexity of the deposition process is reduced since the dielectric material is added after depositing the phase change material instead of with the phase change material. Therefore, the deposition process has a reduced number of elements to control.

As used herein, the term "electrically coupled" is not meant to mean that the elements must be directly coupled together and intervening elements may be provided between the "electrically coupled" elements.

Write circuit 102 is electrically coupled to distribution circuit 104 though signal path 110. Distribution circuit 104 is electrically coupled to each of the memory cells 106a-106d through signal paths 112a-112d. Distribution circuit 104 is electrically coupled to memory cell 106a through signal path 112a. Distribution circuit 104 is electrically coupled to memory cell 106b through signal path 112b. Distribution circuit 104 is electrically coupled to memory cell 106c through signal path 112c. Distribution circuit 104 is electrically coupled to memory cell 106d through signal path 112d. Distribution circuit 104 is electrically coupled to sense circuit 108 through signal path 114. Sense circuit 108 is electrically coupled to controller 118 through signal path 116. Controller 118 is electrically coupled to write circuit 102 through signal path 120 and to distribution circuit 104 through signal path 122.

Each of the memory cells 106a-106d includes a phase change material that may be changed from an amorphous state to a crystalline state or from a crystalline state to an amorphous state under the influence of temperature change. The amount of crystalline phase change material coexisting with amorphous phase change material in one of the memory cells 106a-106d thereby defines two or more states for storing data within memory device 100.

In the amorphous state, a phase change material exhibits significantly higher resistivity than in the crystalline state. Therefore, the two or more states of memory cells 106a-106d differ in their electrical resistivity. In one embodiment, the two or more states include two states and a binary system is used, wherein the two states are assigned bit values of "0" and "1". In another embodiment, the two or more states include three states and a ternary system is used, wherein the three states are assigned bit values of "0", "1", and "2". In another embodiment, the two or more states include four states that are assigned multi-bit values, such as "00", "01", "10", and "11". In other embodiments, the two or more states can be any suitable number of states in the phase change material of a memory cell.

Controller 118 controls the operation of write circuit 102, sense circuit 108, and distribution circuit 104. Controller 118 includes a microprocessor, microcontroller, or other suitable logic circuitry for controlling the operation of write circuit 102, sense circuit 108, and distribution circuit 104. Controller 118 controls write circuit 102 for setting the resistance states of memory cells 106a-106d. Controller 118 controls sense circuit 108 for reading the resistance states of memory cells 106a-106d. Controller 118 controls distribution circuit 104 for selecting memory cells 106a-106d for read or write access. In one embodiment, controller 118 is embedded on the same chip as memory cells 106a-106d. In another embodiment, controller 118 is located on a separate chip from memory cells 106a-106d.

In one embodiment, write circuit 102 provides voltage pulses to distribution circuit 104 through signal path 110, and distribution circuit 104 controllably directs the voltage pulses to memory cells 106a-106d through signal paths 112a-112d. In another embodiment, write circuit 102 provides current pulses to distribution circuit 104 through signal path 110, and distribution circuit 104 controllably directs the current pulses to memory cells 106a-106d through signal paths 112a-112d. In one embodiment, distribution circuit 104 includes a plurality of transistors that controllably direct the voltage pulses or the current pulses to each of the memory cells 106a-106d. In another embodiment, distribution circuit 104 includes a plurality of diodes that controllably direct the voltage pulses or the current pulses to each of the memory cells 106a-106d.

Sense circuit 108 reads each of the two or more states of memory cells 106a-106d through signal path 114. Distribution circuit 104 controllably directs read signals between sense circuit 108 and memory cells 106a-106d through signal paths 112a-112d. In one embodiment, distribution circuit 104 includes a plurality of transistors that controllably direct read signals between sense circuit 108 and memory cells 106a-106d.

In one embodiment, to read the resistance of one of the memory cells 106a-106d, sense circuit 108 provides current that flows through one of the memory cells 106a-106d and sense circuit 108 reads the voltage across that one of the memory cells 106a-106d. In another embodiment, sense circuit 108 provides voltage across one of the memory cells 106a-106d and reads the current that flows through that one of the memory cells 106a-106d. In another embodiment, write circuit 102 provides voltage across one of the memory cells 106a-106d and sense circuit 108 reads the current that flows through that one of the memory cells 106a-106d. In another embodiment, write circuit 102 provides current through one of the memory cells 106a-106d and sense circuit 108 reads the voltage across that one of the memory cells 106a-106d.

To program a memory cell 106a-106d within memory device 100, write circuit 102 generates one or more current or voltage pulses for heating the phase change material in the target memory cell. In one embodiment, write circuit 102 generates appropriate current or voltage pulses, which are fed into distribution circuit 104 and distributed to the appropriate target memory cell 106a-106d. The amplitude and duration of the current or voltage pulses are controlled depending on whether the memory cell is being set or reset.

Figure 3:
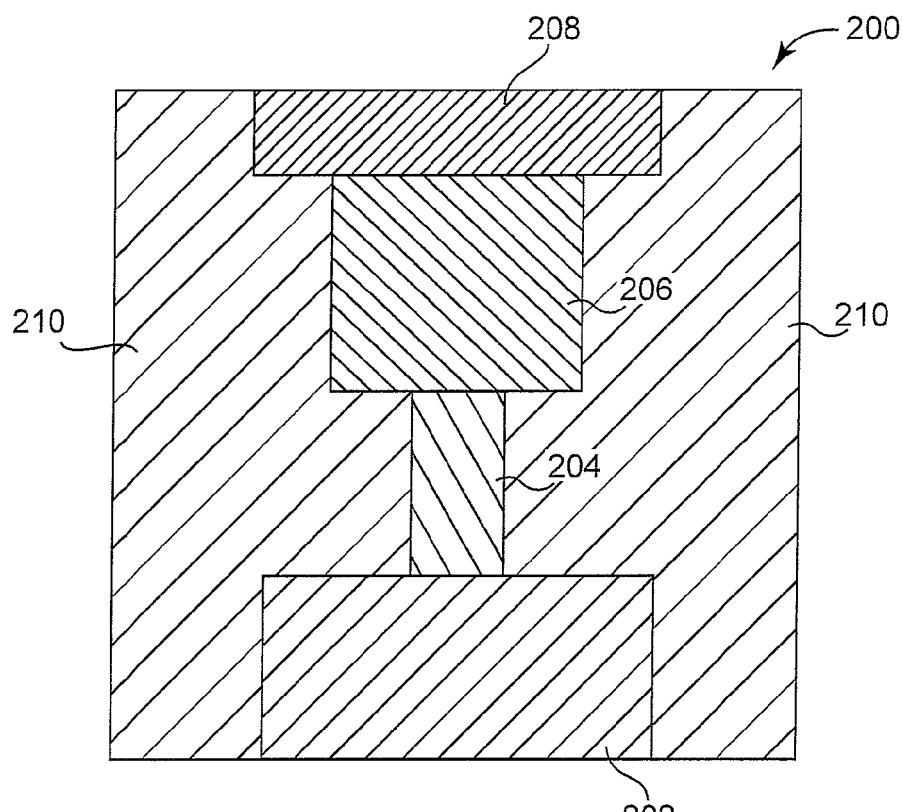
FIG. 3 illustrates a cross-sectional view of one embodiment of a phase change memory cell.

Generally, a "set" operation of a memory cell is heating the phase change material of the target memory cell above its crystallization temperature (but usually below its melting temperature) long enough to achieve the crystalline state or a partially crystalline and partially amorphous state. Generally, a "reset" operation of a memory cell is heating the phase change material of the target memory cell above its melting temperature, and then quickly quench cooling the material, thereby achieving the amorphous state or a partially amorphous and partially crystalline state FIG. 3 illustrates a cross-sectional view of one embodiment of a phase change memory cell 200. In one embodiment, each of the phase change memory cells 106a-106d previously described and illustrated with reference to FIG. 2 is similar to phase change memory cell 200. Phase change memory cell 200 includes a contact 202, a first electrode 204, a phase change element 206, a second electrode 208, and dielectric material 210. Phase change element 206 is fabricated using a damascene process. Phase change element 206 is doped with dielectric material, such as Si, O, N, or other suitable dielectric material. In one embodiment, phase change element 206 is doped by selectively oxidizing one or more components of the deposited phase change material. In another embodiment, phase change element 206 is doped by implanting the deposited phase change material.

Contact 202 includes W, Cu, Al, or other suitable contact material. The top of contact 202 contacts the bottom of first electrode 204. In one embodiment, first electrode 204 has a smaller cross-sectional width than contact 202. First electrode 204 includes TiN, TaN, W, Al, Ti, Ta, TiSiN, TaSiN, TiAlN, TaAlN, WN, C, Cu, or other suitable electrode material. The top of first electrode 204 contacts the bottom of phase change element 206. In one embodiment, phase change element 206 has a greater cross-sectional width than first electrode 204, such that first electrode 204 provides a heater electrode.

In one embodiment, phase change element 206 comprises a phase change material that may be made up of a variety of materials. Generally, chalcogenide alloys that contain one or more elements from Group VI of the periodic table are useful as such materials. In one embodiment, the phase change material is made up of a chalcogenide compound material, such as GeSbTe, SbTe, GeTe, or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Se, and S.

The top of phase change element 206 contacts the bottom of second electrode 208. In one embodiment, second electrode 208 has the same or a greater cross-sectional width than phase change element 206. Second electrode 208 includes TiN, TaN, W, Al, Ti, Ta, TiSiN, TaSiN, TiAlN, TaAlN, WN, C, Cu, or other suitable electrode material. Dielectric material 210 laterally surrounds contact 202, first electrode 204, phase change element 206, and second electrode 208. Dielectric material 210 includes $SiO_2$, $SiO_x$, SiN, SiON, $AlO_x$, fluorinated silica glass (FSG), boro-phosphorus silicate glass (BPSG), boro-silicate glass (BSG), or other suitable dielectric material.

Phase change element 206 provides a storage location for storing one or more bits of data. During operation of memory cell 200, current or voltage pulses are applied between first electrode 204 and second electrode 208 to program the memory cell. The active or phase change region in phase change element 206 is at or close to the interface area between first electrode 204 and phase change element 206.

During a set operation of memory cell 200, one or more set current or voltage pulses are selectively enabled by write circuit 102 and sent to first electrode 204 or second electrode 208. From first electrode 204 or second electrode 208, the set current or voltage pulses pass through phase change element 206 thereby heating the phase change material above its crystallization temperature (but usually below its melting temperature). In this way, the phase change material reaches a crystalline state or a partially crystalline and partially amorphous state during the set operation.

During a reset operation of memory cell 200, a reset current or voltage pulse is selectively enabled by write circuit 102 and sent to first electrode 204 or second electrode 208. From first electrode 204 or second electrode 208, the reset current or voltage pulse passes through phase change element 206. The reset current or voltage quickly heats the phase change material above its melting temperature. After the current or voltage pulse is turned off, the phase change material quickly quench cools into an amorphous state or a partially amorphous and partially crystalline state.

Figure 4:
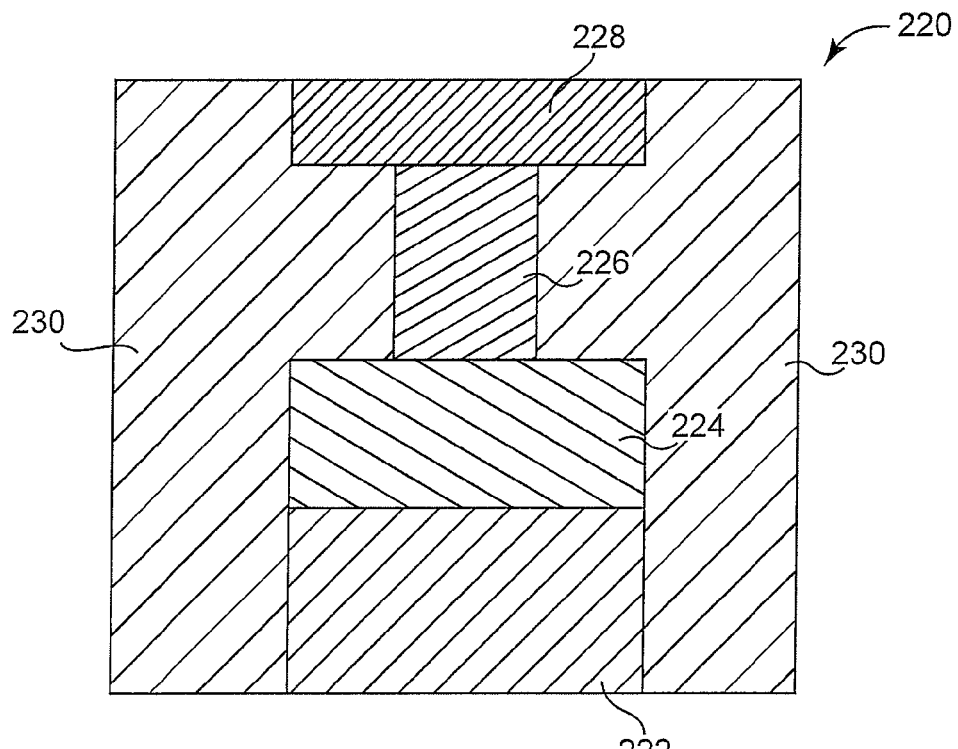
FIG. 4 illustrates a cross-sectional view of another embodiment of a phase change memory cell.

FIG. 4 illustrates a cross-sectional view of another embodiment of a phase change memory cell 220. In one embodiment, each of the phase change memory cells 106a-106d previously described and illustrated with reference to FIG. 2 is similar to phase change memory cell 220. Phase change memory cell 220 includes a contact 222, a first electrode 224, a phase change element 226, a second electrode 228, and dielectric material 230. Phase change element 226 is fabricated using a damascene process. Phase change element 226 is doped with dielectric material, such as Si, O, N, or other suitable dielectric material. In one embodiment, phase change element 226 is doped by selectively oxidizing one or more components of the deposited phase change material. In another embodiment, phase change element 226 is doped by implanting the deposited phase change material.

Contact 222 includes W, Cu, Al, or other suitable contact material. The top of contact 222 contacts the bottom of first electrode 224. In one embodiment, first electrode 224 has the same cross-sectional width as contact 222. First electrode 224 includes TiN, TaN, W, Al, Ti, Ta, TiSiN, TaSiN, TiAlN, TaAlN, WN, C, Cu, or other suitable electrode material. The top of first electrode 224 contacts the bottom of phase change element 226. In one embodiment, phase change element 226 has a smaller cross-sectional width than first electrode 224.

The top of phase change element 226 contacts the bottom of second electrode 228. In one embodiment, second electrode 228 has a greater cross-sectional width than phase change element 226. Second electrode 228 includes TiN, TaN, W, Al, Ti, Ta, TiSiN, TaSiN, TiAlN, TaAlN, WN, C, Cu, or other suitable electrode material. Dielectric material 230 laterally surrounds contact 222, first electrode 224, phase change element 226, and second electrode 228. Dielectric material 230 includes $SiO_2$, $SiO_x$, SiN, SiON, $AlO_x$, FSG, BPSG, BSG, or other suitable dielectric material.

Phase change element 226 provides a storage location for storing one or more bits of data. During operation of memory cell 220, current or voltage pulses are applied between first electrode 224 and second electrode 228 to program the memory cell. The active or phase change region in phase change element 226 is at or close to the center of phase change element 226 between first electrode 224 and second electrode 228. Phase change memory cell 220 is set and reset similarly to phase change memory cell 200 previously described and illustrated with reference to FIG. 3.

Figure 5:
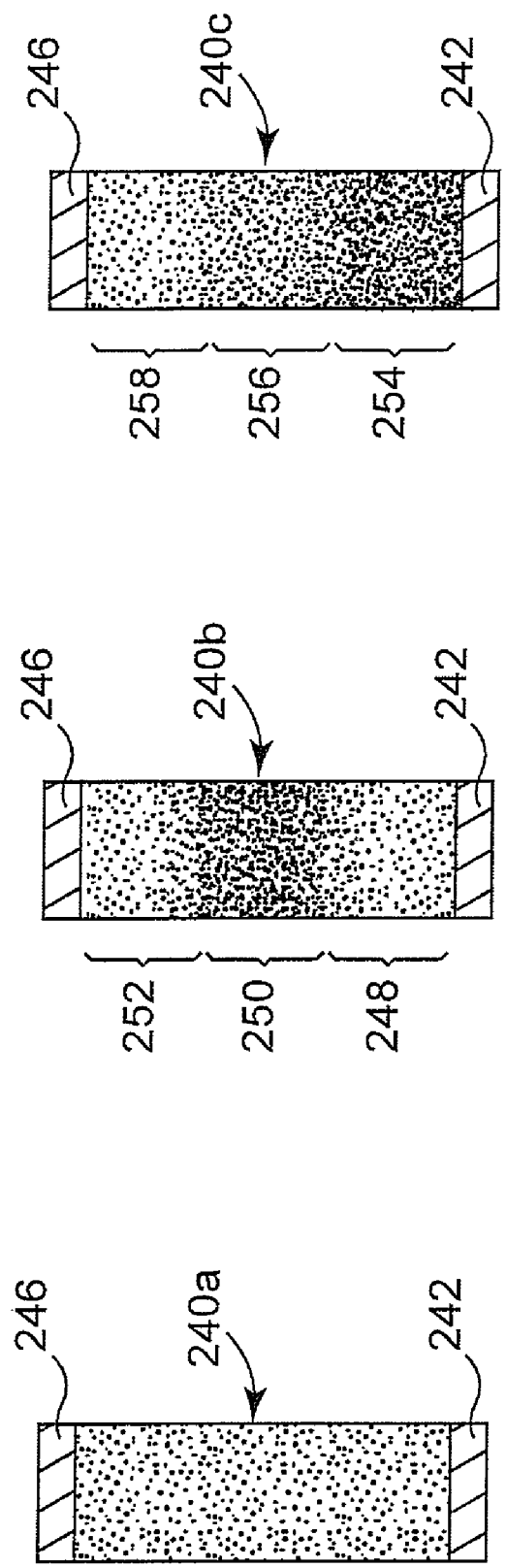
FIG. 5A illustrates a cross-sectional view of one embodiment of a phase change element.
FIG. 5B illustrates a cross-sectional view of another embodiment of a phase change element.
FIG. 5C illustrates a cross-sectional view of another embodiment of a phase change element.

FIG. 5A illustrates a cross-sectional view of one embodiment of a phase change element 240a. In one embodiment, phase change element 240a provides phase change element 206 previously described and illustrated with reference to FIG. 3 or phase change element 226 previously described and illustrated with reference to FIG. 4. One side of phase change element 240a is electrically coupled to a first electrode 242. The other side of phase change element 240a is electrically coupled to a second electrode 246.

Phase change element 240a includes a uniform doping profile. In one embodiment, phase change element 240a is doped using implantation after the phase change material is structured using a damascene process. The implantation conditions are adjusted to provide overlapping implant distributions, which result in the uniform doping profile. The implants include one or more of Si, O, N, or other suitable materials. The implants are implanted using plasma immersion implantation (PIT) or other suitable implantation process.

For example, in one embodiment, GeSbTe is structured using a damascene process. The GeSbTe is then implanted with Si and O to provide phase change element 240a having a uniform doping profile including GeSbTe:Si:O. In another embodiment, GeSbTe is structured using a damascene process. The GeSbTe is then implanted with Si and N to provide phase change element 240a having a uniform doping profile including GeSbTe:Si:N. In another embodiment, GeSb is structured using a damascene process. The GeSb is then implanted with Si and O to provide phase change element 240a having a uniform doping profile including GeSb:Si:O. In another embodiment, GeSb is structured using a damascene process. The GeSb is then implanted with Si and N to provide phase change element 240a having a uniform doping profile including GeSb:Si:N. In other embodiments, other suitable phase change materials are doped with other suitable dielectric materials to provide phase change element 240a.

FIG. 5B illustrates a cross-sectional view of another embodiment of a phase change element 240b. In one embodiment, phase change element 240b provides phase change element 206 previously described and illustrated with reference to FIG. 3 or phase change element 226 previously described and illustrated with reference to FIG. 4. One side of phase change element 240b is electrically coupled to a first electrode 242. The other side of phase change element 240b is electrically coupled to a second electrode 246.

Phase change element 240b includes a doping profile in which the doping level increases toward the center of phase change element 240b. Phase change element 240b includes a first region 248, a second region 250, and a third region 252. The doping level of second region 250 is greater than the doping level of first region 248 and the doping level of third region 252. In one embodiment, the doping level of first region 248 is substantially equal to the doping level of third region 252. By having a greater doping level in second region 250, phase change element 240b heats more in second region 250 than in first region 248 and third region 252 in response to a current or voltage pulse. The increased heating of phase change element 240b in second region 250 reduces the current used to reset phase change element 240b and increases the endurance of phase change element 240b.

In one embodiment, phase change element 240b is doped using implantation after the phase change material is structured using a damascene process. The implantation conditions are adjusted to provide the doping profile in which second region 250 has a greater doping level than first region 248 and second region 252. The implants include one or more of Si, O, N, or other suitable materials. The implants are implanted using PII or other suitable implantation process.

FIG. 5C illustrates a cross-sectional view of another embodiment of a phase change element 240c. In one embodiment, phase change element 240c provides phase change element 206 previously described and illustrated with reference to FIG. 3 or phase change element 226 previously described and illustrated with reference to FIG. 4. One side of phase change element 240c is electrically coupled to a first electrode 242. The other side of phase change element 240c is electrically coupled to a second electrode 246.

Phase change element 240c includes a doping profile in which the doping level varies within each region of phase change element 240c. Phase change element 240c includes a first region 254, a second region 256, and a third region 258. In one embodiment, the doping level of first region 254 is greater than the doping level of second region 256, and the doping level of second region 256 is greater than the doping level of third region 258. In another embodiment, the doping level of second region 256 is greater than the doping level of first region 254, and the doping level of first region 254 is greater than the doping level of third region 258. In another embodiment, the doping level of third region 258 is greater than the doping level of first region 254, and the doping level of first region 254 is greater than the doping level of second region 256.

By varying the doping level within each region 254, 256, and 258, the heating within each region 254, 256, and 258 in response to a current or voltage pulse varies. In one embodiment, this variation within each region 254, 256, and 258 is used to program phase change element 240c to multiple states to store more than one data bit. In one embodiment, phase change element 240c is doped using implantation after the phase change material is structured using a damascene process. The implantation conditions are adjusted to provide the doping profile in which each region 254, 256, and 258 has a different doping level. The implants include one or more of Si, O, N, or other suitable materials. The implants are implanted using PII or other suitable implantation process.

In another embodiment, instead of varying the doping level of each region 254, 256, and 258, the dopants or dielectric material used for each region 254, 256, and 258 vary. For example, in one embodiment, region 254 is implanted with a first dopant, region 256 is implanted with a second dopant different from the first dopant, and region 258 is implanted with a third dopant different from the first and second dopants. In another embodiment, instead of varying the doping in each of the three different regions 254, 256, and 258, more than three different regions are used or gradual transitions or graded doping profiles are used.

The following FIGS. 6-10 illustrate embodiments for fabricating a phase change memory cell, such as phase change memory cell 200 previously described and illustrated with reference to FIG. 3.

Figure 6:
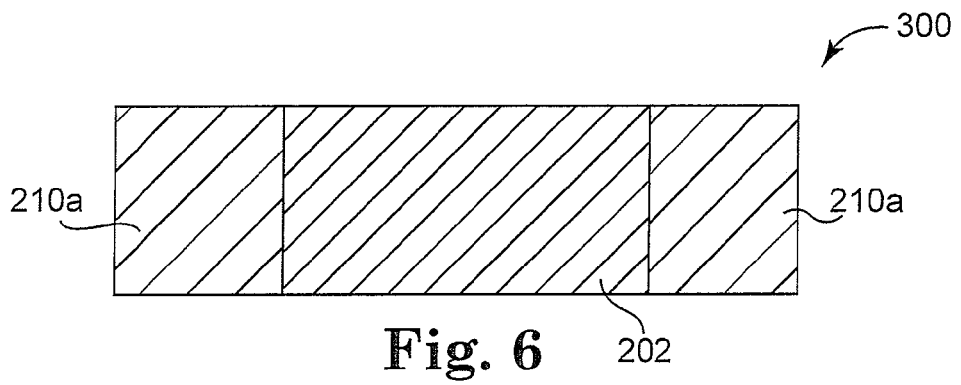
FIG. 6 illustrates a cross-sectional view of one embodiment of a preprocessed wafer.

FIG. 6 illustrates a cross-sectional view of one embodiment of a preprocessed wafer 300. Preprocessed wafer 300 includes dielectric material 210a, a contact 202, and lower wafer layers (not shown). Dielectric material 210a laterally surrounds contact 202 to isolate contact 202 from adjacent device features. Dielectric material 210a includes $SiO_2$, $SiO_x$, SiN, SiON, $AlO_x$, FSG, BPSG, BSG, or other suitable dielectric material. Contact 202 includes W, Cu, Al, or other suitable contact material.

Figure 7:
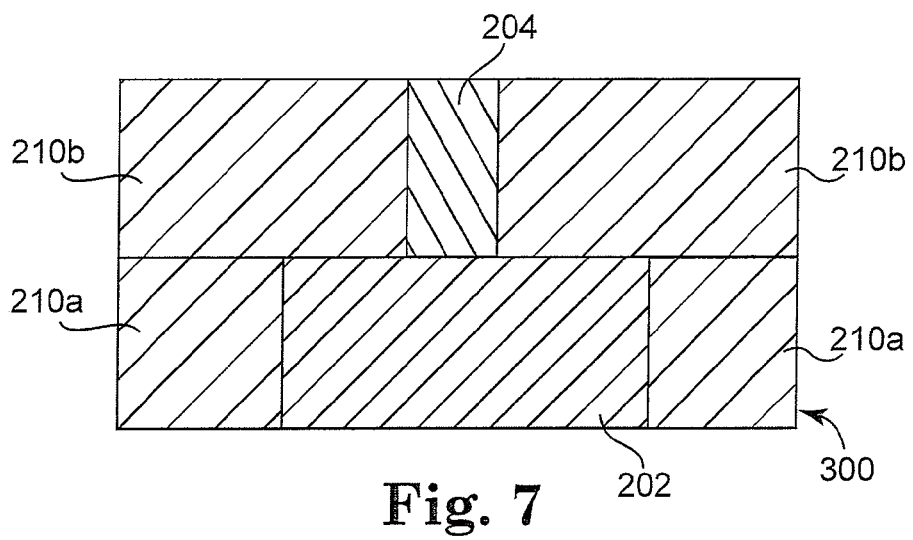
FIG. 7 illustrates a cross-sectional view of one embodiment of the preprocessed wafer, a first dielectric material layer, and a first electrode.

FIG. 7 illustrates a cross-sectional view of one embodiment of preprocessed wafer 300, a first dielectric material layer 210b, and a first electrode 204. In one embodiment, a dielectric material, such as $SiO_2$, $SiO_x$, SiN, SiON, $AlO_x$, FSG, BPSG, BSG, or other suitable dielectric material is deposited over preprocessed wafer 300 to provide a dielectric material layer. The dielectric material layer is deposited using chemical vapor deposition (CVD), high density plasma-chemical vapor deposition (HDP-CVD), atomic layer deposition (ALD), metal organic chemical vapor deposition (MOCVD), plasma vapor deposition (PVD), jet vapor deposition (JVD), or other suitable deposition technique. A portion of the dielectric material layer is then etched to provide first dielectric material layer 210b and an opening exposing a portion of contact 202.

An electrode material, such as TiN, TaN, W, Al, Ti, Ta, TiSiN, TaSiN, TiAlN, TaAlN, WN, C, Cu, or other suitable electrode material is deposited over exposed portions of first dielectric material layer 210b and contact 202 to provide an electrode material layer. The electrode material layer is deposited using CVD, HDP-CVD, ALD, MOCVD, PVD, JVD, or other suitable deposition technique. The electrode material layer is then planarized to expose first dielectric material layer 210b and to provide first electrode 204. The electrode material layer is planarized using chemical mechanical planarization (CMP) or another suitable planarization technique.

In another embodiment, an electrode material, such as TiN, TaN, W, Al, Ti, Ta, TiSiN, TaSiN, TiAlN, TaAlN, WN, C, Cu, or other suitable electrode material is deposited over preprocessed wafer 300 to provide an electrode material layer. The electrode material layer is deposited using CVD, HDP-CVD, ALD, MOCVD, PVD, JVD, or other suitable deposition technique. The electrode material layer is then etched to expose portions of preprocessed wafer 300 and to provide first electrode 204 contacting contact 202.

A dielectric material, such as $SiO_2$, $SiO_x$, SiN, SiON, $AlO_x$, FSG, BPSG, BSG, or other suitable dielectric material is deposited over exposed portions of preprocessed wafer 300 and first electrode 204 to provide a dielectric material layer. The dielectric material layer is deposited using CVD, HDP-CVD, ALD, MOCVD, PVD, JVD, or other suitable deposition technique. The dielectric material layer is then planarized to expose first electrode 204 and to provide first dielectric material layer 210b. The dielectric material layer is planarized using CMP or another suitable planarization technique.

Figure 8:
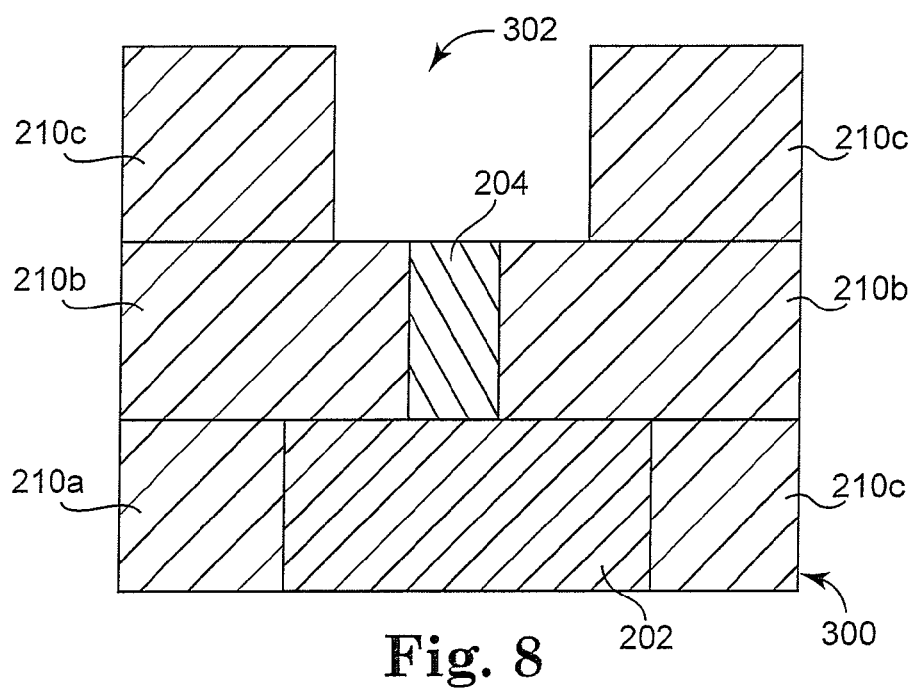
FIG. 8 illustrates a cross-sectional view of one embodiment of the preprocessed wafer, the first dielectric material layer, the first electrode, and a second dielectric material layer.

FIG. 8 illustrates a cross-sectional view of one embodiment of preprocessed wafer 300, first dielectric material layer 210b, first electrode 204, and a second dielectric material layer 210c. A dielectric material, such as $SiO_2$, $SiO_x$, SiN, SiON, $AlO_x$, FSG, BPSG, BSG, or other suitable dielectric material is deposited over exposed portions of first dielectric material layer 210b and first electrode 204 to provide a dielectric material layer. The dielectric material layer is deposited using CVD, HDP-CVD, ALD, MOCVD, PVD, JVD, or other suitable deposition technique. A portion of the dielectric material layer is then etched to provide second dielectric material layer 210c and opening 302 exposing first electrode 204 and a portion of first dielectric material layer 210b. In one embodiment, the depth or vertical dimension of opening 302 is greater than or equal to the width or horizontal dimension of opening 302.

Figure 9:
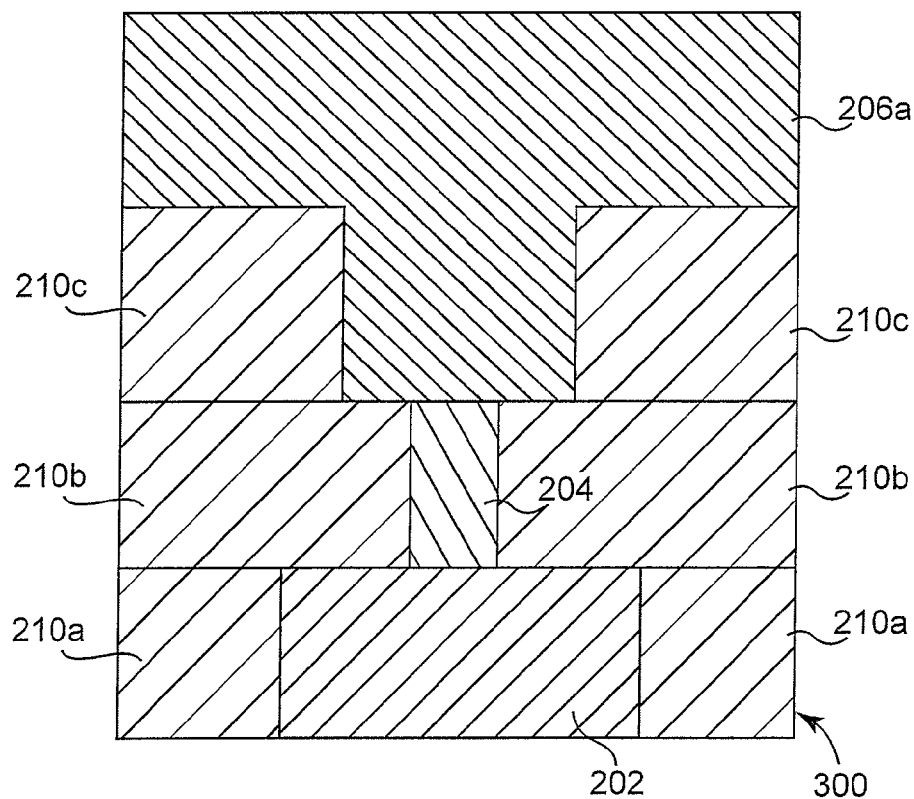
FIG. 9 illustrates a cross-sectional view of one embodiment of the preprocessed wafer, the first dielectric material layer, the first electrode, the second dielectric material layer, and a phase change material layer.

FIG. 9 illustrates a cross-sectional view of one embodiment of preprocessed wafer 300, first dielectric material layer 210b, first electrode 204, second dielectric material layer 210c, and a phase change material layer 206a. A phase change material, such as a chalcogenide compound material or other suitable phase change material is deposited over exposed portions of second dielectric material layer 210c, first dielectric material layer 210b, and first electrode 204 to provide phase change material layer 206a. Phase change material layer 206a is deposited using CVD, ALD, PVD, solution based spin-on, or other suitable deposition technique.

Figure 10:
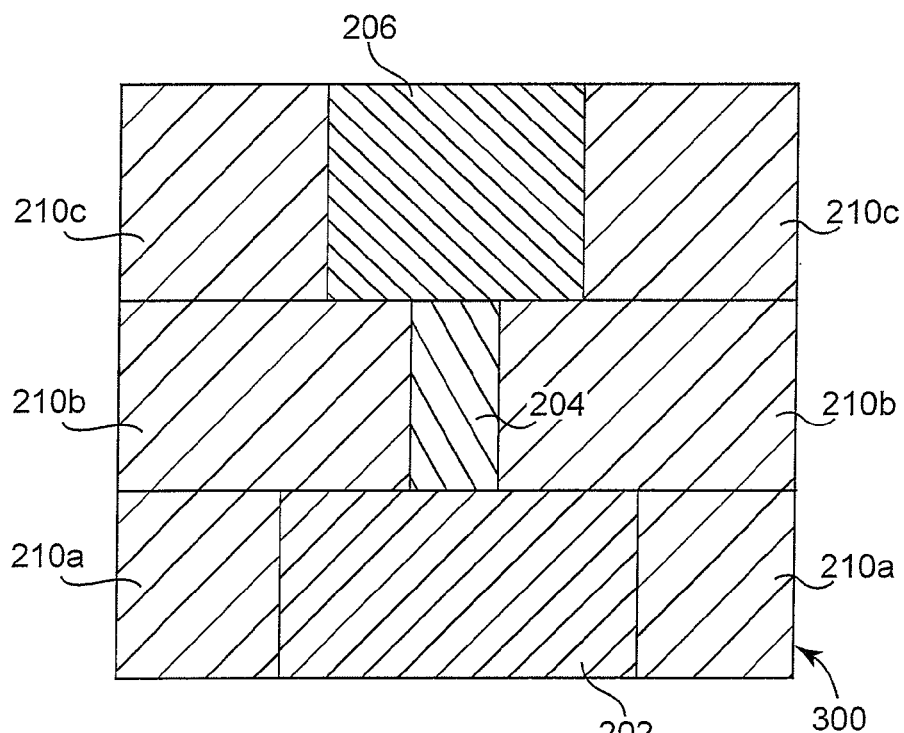
FIG. 10 illustrates a cross-sectional view of one embodiment of the preprocessed wafer, the first dielectric material layer, the first electrode, the second dielectric material layer, and a phase change element.

FIG. 10 illustrates a cross-sectional view of one embodiment of preprocessed wafer 300, first dielectric material layer 210b, first electrode 204, second dielectric material layer 210c, and a phase change element 206. Phase change material layer 206a is planarized to expose second dielectric material layer 210c and to provide phase change element 206. Phase change material layer 206a is planarized using CMP or another suitable planarization technique.

Phase change element 206 is then doped with dielectric material. In one embodiment, phase change element 206 is implanted with dielectric material to provide a doping profile as previously described and illustrated with reference to FIGS. 5A-5C. In another embodiment, phase change element 206 is doped by selectively oxidizing one or more components of the deposited phase change material. In one embodiment, the phase change material is selectively oxidized after phase change element 206 is structured. In another embodiment, the phase change material is selectively oxidized after a partial deposition of phase change material layer 206a, such as after depositing 2 nm, 5 nm, 10 nm, or other suitable amount of phase change material.

In one embodiment, an electrode material, such as TiN, TaN, W, Al, Ti, Ta, TiSiN, TaSiN, TiAlN, TaAlN, WN, C, Cu, or other suitable electrode material is deposited over phase change element 206 and second dielectric material layer 210c to provide an electrode material layer. The electrode material layer is deposited using CVD, HDP-CVD, ALD, MOCVD, PVD, JVD, or other suitable deposition technique. The electrode material layer is then etched to expose portions of second dielectric material layer 210c and to provide second electrode 208 previously described and illustrated with reference to FIG. 3.

A dielectric material, such as $SiO_2$, $SiO_x$, SiN, SiON, $AlO_x$, FSG, BPSG, BSG, or other suitable dielectric material is deposited over exposed portions of second dielectric material layer 210c and second electrode 208 to provide a dielectric material layer. The dielectric material layer is deposited using CVD, HDP-CVD, ALD, MOCVD, PVD, JVD, or other suitable deposition technique. The dielectric material layer is then planarized to expose second electrode 208 and to provide dielectric material 210, which includes dielectric material 210a-210c. The dielectric material layer is planarized using CMP or another suitable planarization technique. In this way, phase change memory cell 200 previously described and illustrated with reference to FIG. 3 is provided.

In another embodiment, a dielectric material, such as $SiO_2$, $SiO_x$, SiN, SiON, $AlO_x$, FSG, BPSG, BSG, or other suitable dielectric material is deposited over exposed portions of second dielectric material layer 210c and phase change element 206 to provide a dielectric material layer. The dielectric material layer is deposited using CVD, HDP-CVD, ALD, MOCVD, PVD, JVD, or other suitable deposition technique. A portion of the dielectric material layer is then etched to provide an opening exposing phase change element 206 and to provide dielectric material 210, which includes dielectric material 210a-210c.

An electrode material, such as TiN, TaN, W, Al, Ti, Ta, TiSiN, TaSiN, TiAlN, TaAlN, WN, C, Cu, or other suitable electrode material is deposited over exposed portions of phase change element 206 and dielectric material 210 to provide an electrode material layer. The electrode material layer is deposited using CVD, HDP-CVD, ALD, MOCVD, PVD, JVD, or other suitable deposition technique. The electrode material layer is then planarized to expose dielectric material 210 and to provide second electrode 208 and memory cell 200 previously described and illustrated with reference to FIG. 3.

The following FIGS. 11-15 illustrate embodiments for fabricating a phase change memory cell, such as phase change memory cell 220 previously described and illustrated with reference to FIG. 4.

Figure 11:
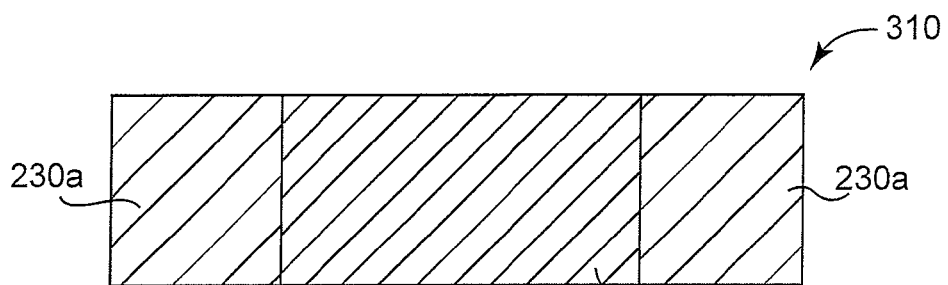
FIG. 11 illustrates a cross-sectional view of one embodiment of a preprocessed wafer.

FIG. 11 illustrates a cross-sectional view of one embodiment of a preprocessed wafer 310. Preprocessed wafer 310 includes dielectric material 230a, a contact 222, and lower wafer layers (not shown). Dielectric material 230a laterally surrounds contact 222 to isolate contact 222 from adjacent device features. Dielectric material 230a includes $SiO_2$, $SiO_x$, SiN, SiON, $AlO_x$, FSG, BPSG, BSG, or other suitable dielectric material. Contact 222 includes W, Cu, Al, or other suitable contact material.

Figure 12:
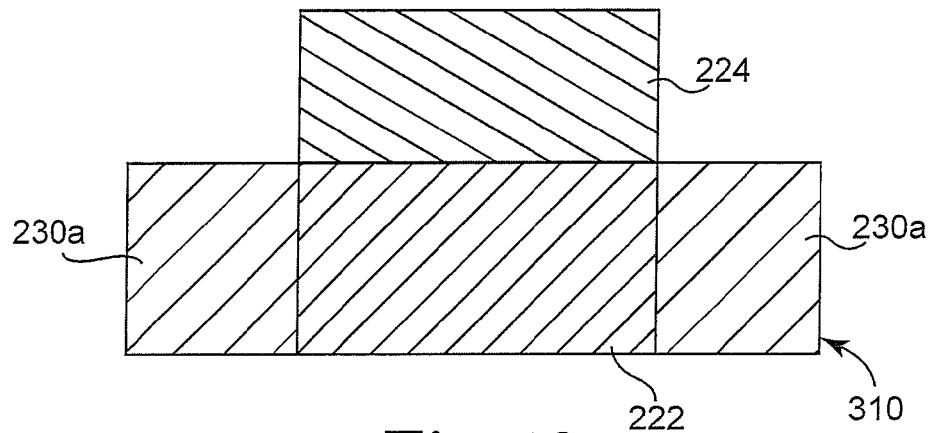
FIG. 12 illustrates a cross-sectional view of one embodiment of the preprocessed wafer and a first electrode.

FIG. 12 illustrates a cross-sectional view of one embodiment of preprocessed wafer 310 and a first electrode 224. An electrode material, such as TiN, TaN, W, Al, Ti, Ta, TiSiN, TaSiN, TiAlN, TaAlN, WN, C, Cu, or other suitable electrode material is deposited over preprocessed wafer 310 to provide an electrode material layer. The electrode material layer is deposited using CVD, HDP-CVD, ALD, MOCVD, PVD, JVD, or other suitable deposition technique. A portion of the electrode material layer is then etched to expose portions of preprocessed wafer 310 and to provide second electrode 224 contacting contact 222.

Figure 13:
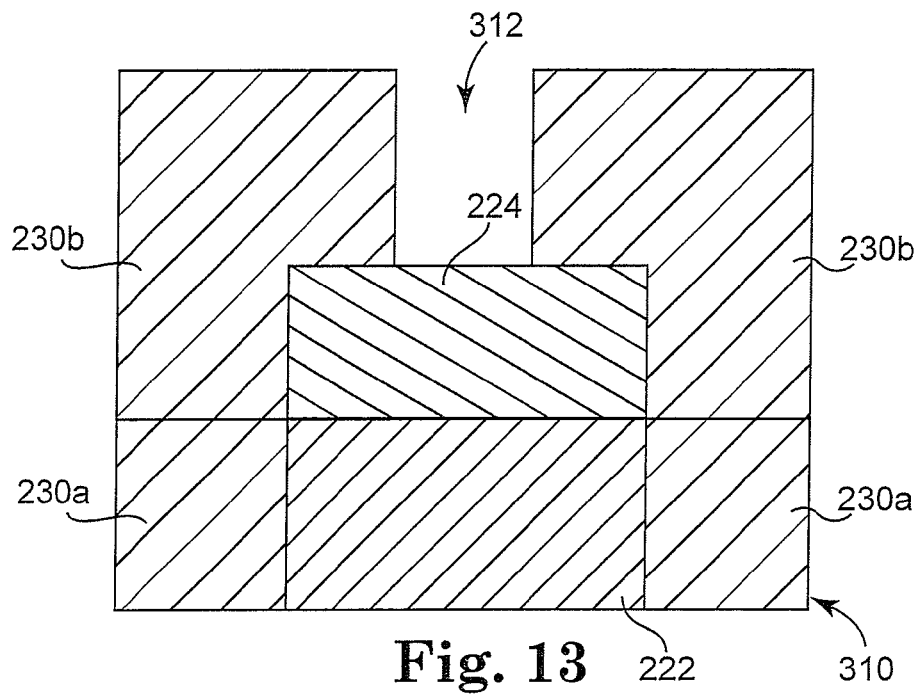
FIG. 13 illustrates a cross-sectional view of one embodiment of the preprocessed wafer, the first electrode, and a dielectric material layer.

FIG. 13 illustrates a cross-sectional view of one embodiment of preprocessed wafer 310, first electrode 224, and a dielectric material layer 230b. A dielectric material, such as $SiO_2$, $SiO_x$, SiN, SiON, $AlO_x$, FSG, BPSG, BSG, or other suitable dielectric material is deposited over exposed portions of preprocessed wafer 310 and first electrode 224 to provide a dielectric material layer. The dielectric material layer is deposited using CVD, HDP-CVD, ALD, MOCVD, PVD, JVD, or other suitable deposition technique. A portion of the dielectric material layer is then etched to provide opening 312 exposing a portion of first electrode 224. In one embodiment, the depth or vertical dimension of opening 312 is greater than or equal to the width or horizontal dimension of opening 312.

Figure 14:
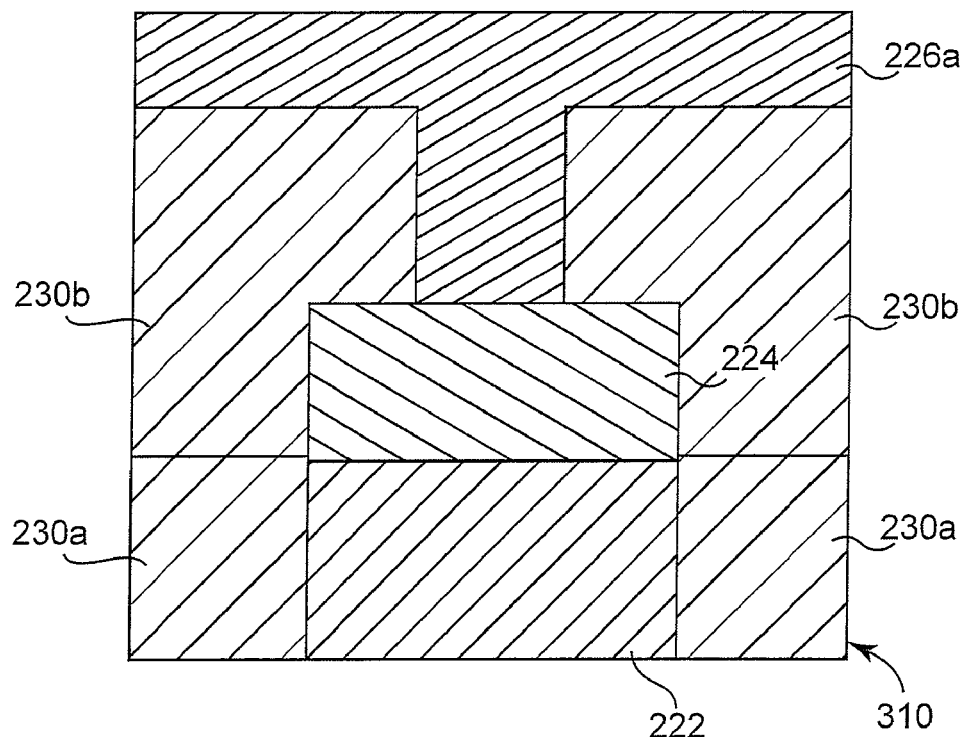
FIG. 14 illustrates a cross-sectional view of one embodiment of the preprocessed wafer, the first electrode, the dielectric material layer, and a phase change material layer.

FIG. 14 illustrates a cross-sectional view of one embodiment of preprocessed wafer 310, first electrode 224, dielectric material layer 230b, and a phase change material layer 226a. A phase change material, such as a chalcogenide compound material or other suitable phase change material is deposited over exposed portions of dielectric material layer 230b and first electrode 224 to provide phase change material layer 226a. Phase change material layer 226a is deposited using CVD, ALD, PVD, solution based spin-on, or other suitable deposition technique.

Figure 15:
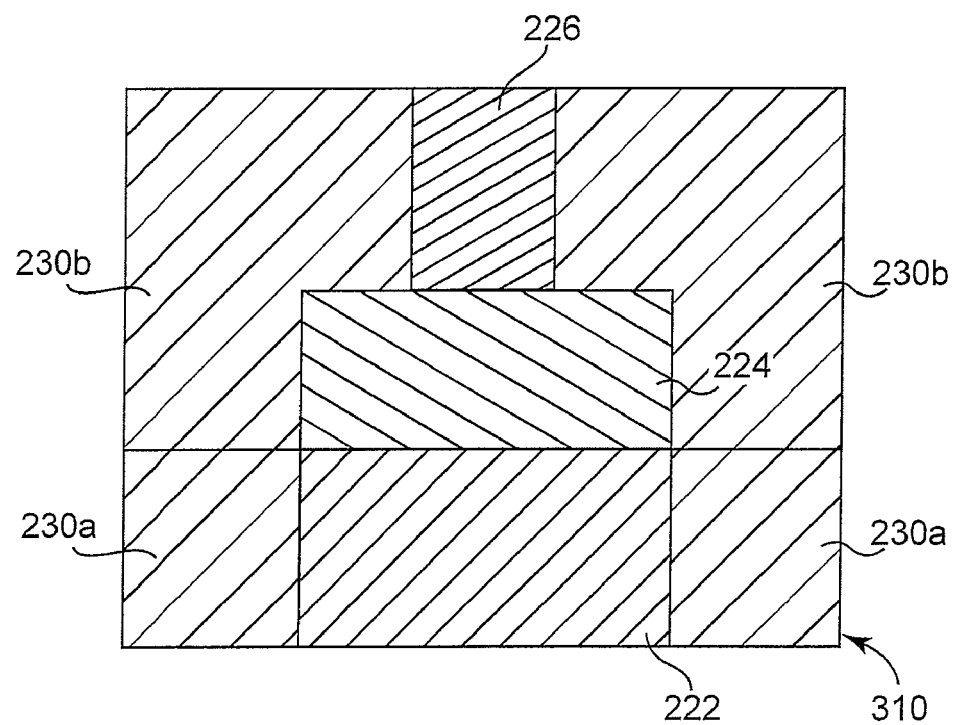
FIG. 15 illustrates a cross-sectional view of one embodiment of the preprocessed wafer, the first electrode, the dielectric material layer, and a phase change element.

FIG. 15 illustrates a cross-sectional view of one embodiment of preprocessed wafer 310, first electrode 224, dielectric material layer 230b, and a phase change element 226. Phase change material layer 226a is planarized to expose dielectric material layer 230b and to provide phase change element 226. Phase change material layer 226a is planarized using CMP or another suitable planarization technique.

Phase change element 226 is then doped with dielectric material. In one embodiment, phase change element 226 is implanted with dielectric material to provide a doping profile as previously described and illustrated with reference to FIGS. 5A-5C. In another embodiment, phase change element 226 is doped by selectively oxidizing one or more components of the deposited phase change material. In one embodiment, the phase change material is selectively oxidized after phase change element 226 is structured. In another embodiment, the phase change material is selectively oxidized after a partial deposition of phase change material layer 226a, such as after depositing 2 nm, 5 nm, 10 nm, or other suitable amount of phase change material.

Second electrode 228 and dielectric material 230, which includes dielectric material 230a and 230b, of memory cell 220 previously described and illustrated with reference to FIG. 4 are then fabricated similarly to second electrode 208 and dielectric material 210 as previously described with reference to FIG. 10.

Figure 16:
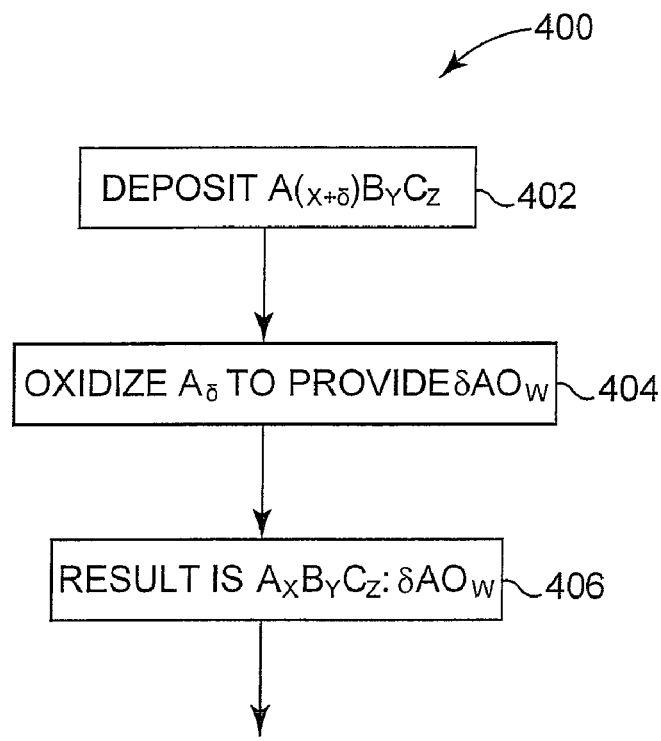
FIG. 16 is a flow diagram illustrating one embodiment of a method for doping a phase change material.

FIG. 16 is a flow diagram illustrating one embodiment of a method 400 for doping a phase change material by selectively oxidizing the phase change material. At 402, a phase change material having two or three elements such as $A_{(x+\delta)}B_yC_z$ is deposited, wherein $A_x$, $B_y$, and $C_z$ are elements within a phase change material compound and $A_\delta$ is an excess amount of A not used in the phase change material compound. The phase change material is deposited using CVD, ALD, PVD, or solution based spin-on. At 404, the excess amount $A_\delta$ is oxidized to provide $\delta AO_w$. In this way, at 406 the resulting doped phase change material is given by $A_xB_yC_z{:}\delta AO_w$. In one embodiment, the oxidation is performed after all the phase change material has been deposited. In other embodiments, the oxidation is performed after a part of the deposition, such as after 2 nm, 5 nm, 10 nm, or other suitable amount of phase change material has been deposited.

For example, in one embodiment, a phase change material including $Ge_{(2+x)}Sb_2Te_5$ is deposited. The excess $Ge_x$ is then selectively oxidized to provide $Ge_2Sb_2Te_5{:}(x)GeO_2$. In another embodiment, $Ge_{(x+\delta)}Sb_y$ is deposited. The excess $Ge_\delta$ is then selectively oxidized to provide $Ge_xSb_y{:}\delta GeO_2$. In another embodiment, $Si_{2.2}Sb_2Te_5$ is deposited. The excess $Si_{0.2}$ is then selectively oxidized to provide $Si_2Sb_2Te_5{:}(0.2)SiO_2$.

FIGS. 17A-17G are graphs 420a-420g illustrating one embodiment of results from an x-ray photoelectron spectroscopy (XPS) analysis of an oxidized GeSbTe phase change material sample. The phase change material was oxidized in air at room temperature. Each graph 420a-420g includes time in minutes on x-axis 422 and atomic fraction in percent on y-axis 424.

Figure 17A:
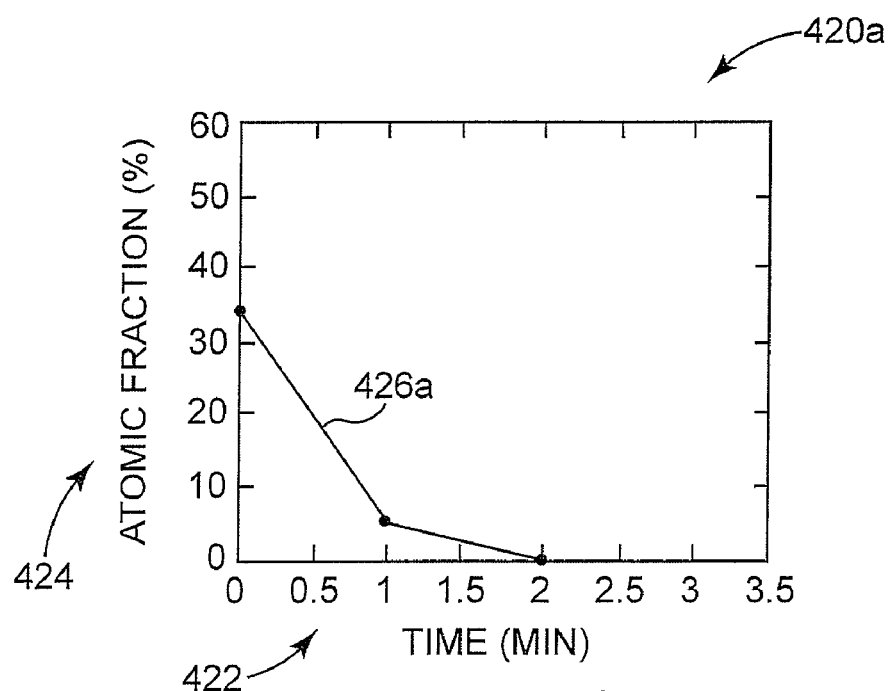
FIGS. 17A-17G are graphs illustrating one embodiment of results from an x-ray photoelectron spectroscopy (XPS) analysis of an oxidized phase change material sample.
Figure 17B:
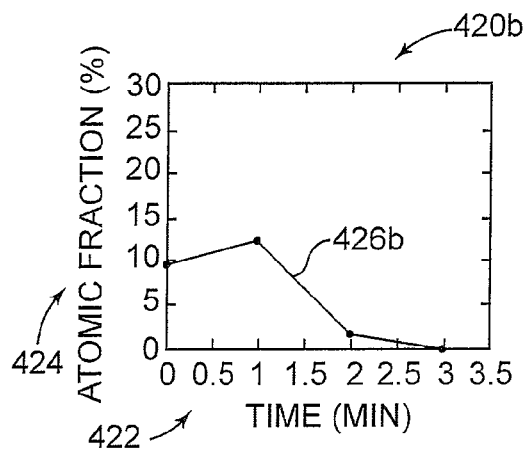
Figure 17C:
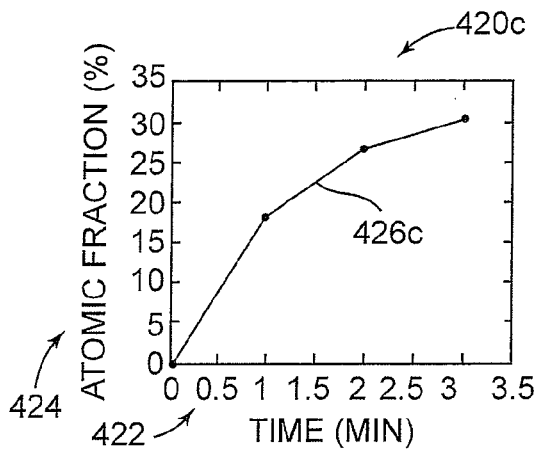
Figure 17D:
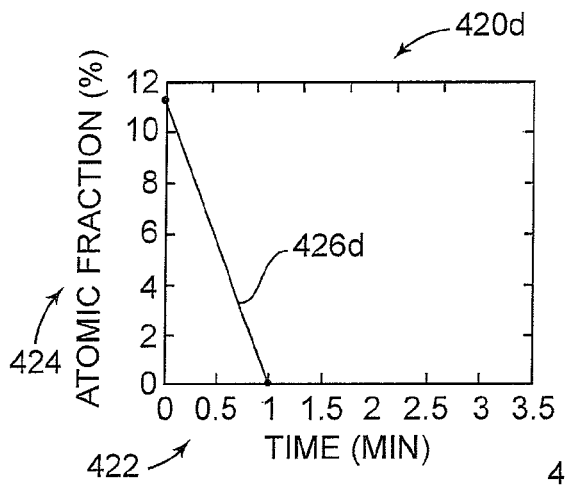
Figure 17E:
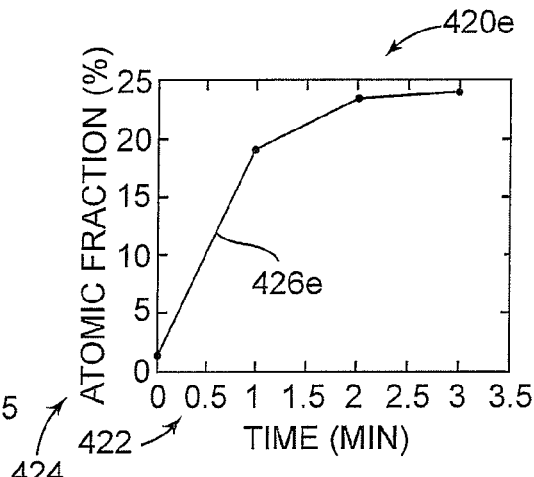
Figure 17F:
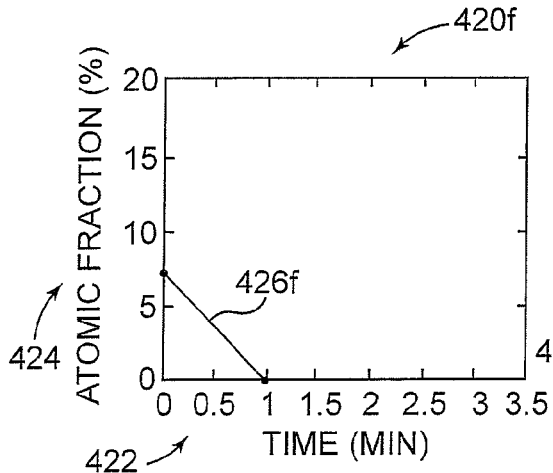
Figure 17G:
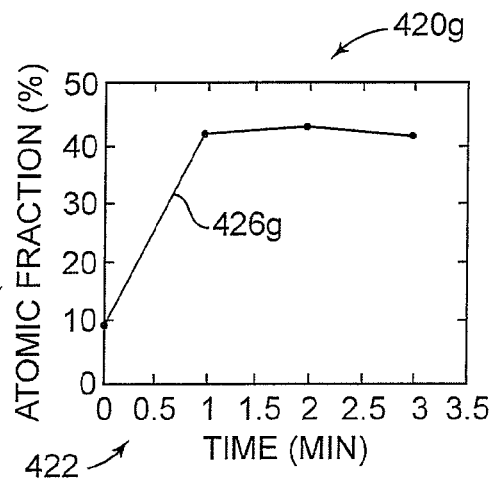

FIG. 17A is a graph 420a illustrating one embodiment of an XPS analysis of oxygen in the sample. Curve 426a illustrates the results and shows how the amount of oxygen varies depending on the depth in the sample. FIG. 17B is a graph 420b illustrating one embodiment of an XPS analysis of Ge oxide in the sample as indicated by curve 426b. FIG. 17C is a graph 420c illustrating one embodiment of an XPS analysis of Ge metal in the sample as indicated by curve 426c. FIG. 17D is a graph 420d illustrating one embodiment of an XPS analysis of Sb oxide in the sample as indicated by curve 426d. FIG. 17E is a graph 420e illustrating one embodiment of an XPS analysis of Sb metal in the sample as indicated by curve 426e. FIG. 17F is a graph 420f illustrating one embodiment of an XPS analysis of Te oxide in the sample as indicated by curve 426f. FIG. 17G is a graph 420g illustrating one embodiment of an XPS analysis of Te metal in the sample as indicated by curve 426g.

As indicated by graphs 420b-420g, Ge oxidizes more and has a deeper penetration than Sb and Te. Therefore, in one embodiment, for GeSbTe phase change material, excess Ge is deposited and oxidized to provide the doped phase change material. For other phase change materials, a similar analysis is preformed to determine which element oxidizes the most and has the deepest penetration. The element that oxidizes the most and has the deepest penetration may then be selected to be deposited in excess and then selectively oxidized to provide the doped phase change material.

Embodiments provide a phase change memory cell including a phase change element doped with dielectric material. The phase change element is deposited and structured using a damascene process and doped by oxidation or by implantation. By doping the phase change material after it deposited instead of during the deposition, the number of elements that are controlled during the deposition process is reduced, thereby reducing the complexity of the deposition process.

While the specific embodiments described herein substantially focused on fabricating phase change memory cells, the embodiments can be applied to any suitable type of resistive or resistivity changing memory cells.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
a first electrode;
a second electrode; and
a damascene structured memory element coupled to the first electrode and the second electrode, the memory element having a height and a width, the height greater than or equal to the width, the memory element comprising resistance changing material doped with dielectric material,
wherein the memory element comprises oxidized resistance changing material.

2. The integrated circuit of claim 1, wherein the memory element comprises resistance changing material implanted with dielectric material.

3. The integrated circuit of claim 1, wherein the dielectric material comprises at least one of Si, O, and N.

4. The integrated circuit of claim 1, wherein the memory element includes a first region and a second region, the resistance changing material in the first region having a different doping level than the resistance changing material in the second region.

5. The integrated circuit of claim 1, wherein the memory element includes a first region and a second region, the resistance changing material in the first region doped with a first dielectric material and the resistance changing material in the second region doped with a second dielectric material different from the first dielectric material.

6. A system comprising:
a host; and
a memory device communicatively coupled to the host, the memory device comprising:
a first electrode;
a second electrode; and
a damascene structured memory element coupled to the first electrode and the second electrode, the memory element have a vertical dimension and a horizontal dimension, the vertical dimension greater than or equal to the horizontal dimension, the memory element comprising phase change material doped with dielectric material,
wherein the memory element comprises oxidized phase change material.

7. The system of claim 6, wherein the memory element comprises phase change material implanted with dielectric material.

8. The system of claim 6, wherein the memory element includes a first region, a second region, and a third region between the first region and the second region, the phase change material in the third region having a greater doping level than the phase change material in the first and second regions.

9. The system of claim 6, wherein the memory element includes a first region, a second region, and a third region between the first region and the second region, the phase change material in each of the first, second, and third regions having different doping levels.

10. The system of claim 6, wherein the memory element includes a first region, a second region, and a third region between the first region and the second region, the phase change material in each of the first, second, and third regions doped with a different dielectric material.

11. The system of claim 6, wherein the memory device further comprises:
a write circuit configured to program the memory element;
a sense circuit configured to read the memory element; and
a controller configured to control the write circuit and the sense circuit.

12. A method for fabricating the integrated circuit of claim 1, the method comprising:
providing the first electrode;
depositing a dielectric material layer over the first electrode;
etching the dielectric material layer to provide an opening exposing at least a portion of the first electrode, the opening having a depth and a width, the depth greater than or equal to the width;
depositing resistance changing material in the opening;
doping the resistance changing material with dielectric material; and
fabricating the second electrode over the resistance changing material,
wherein doping the resistance changing material comprises oxidizing the resistance changing material.

13. The method of claim 12, further comprising:
depositing additional resistance changing material in the opening over the oxidized resistance changing material.

14. The method of claim 12, wherein depositing the resistance changing material comprises depositing an excess of one element of the resistance changing material, and
wherein oxidizing the resistance changing material comprises oxidizing the excess of the one element.

15. The method of claim 12, wherein doping the resistance changing material comprises implanting the resistance changing material with dielectric material.

16. The method of claim 15, wherein implanting the resistance changing material comprises implanting the resistance changing material with one of Si, O, and N.

17. The method of claim 15, wherein implanting the resistance changing material comprises implanting a first portion of the resistance changing material to have a first doping level and implanting a second portion of the resistance changing material to have a second doping level different from the first doping level.

18. The method of claim 15, wherein implanting the resistance changing material comprises implanting a first portion of the resistance changing material with a first dielectric material and implanting a second portion of the resistance changing material with a second dielectric material different from the first dielectric material.

19. The method of claim 12, wherein depositing the resistance changing material comprises depositing the resistance changing material using one of chemical vapor deposition, atomic layer deposition, physical vapor deposition, and spin-on.

20. The method of claim 12, wherein depositing the resistance changing material comprises depositing a phase change material.

21. An integrated circuit comprising:
a first electrode;
a second electrode; and
a damascene structured memory element coupled to the first electrode and the second electrode, the memory element having a height and a width, the height greater than or equal to the width, the memory element comprising phase change material doped with dielectric material, and the memory element comprising oxidized phase change material.

* * * * *